(12) United States Patent
Labbe et al.

(10) Patent No.: US 12,078,661 B2
(45) Date of Patent: Sep. 3, 2024

(54) CURRENT TRANSDUCER WITH MAGNETIC FIELD DETECTOR MODULE

(71) Applicant: LEM INTERNATIONAL SA, Meyrin (CH)

(72) Inventors: Arnaud Labbe, St. Girod (FR); Gérard Lepine, Peillonnex (FR); David Seron, Bron (FR)

(73) Assignee: LEM INTERNATIONAL SA, Meyrin (CH)

( * ) Notice: Subject to any disclaimer, the term of this patent is extended or adjusted under 35 U.S.C. 154(b) by 404 days.

(21) Appl. No.: 17/426,393

(22) PCT Filed: Jan. 27, 2020

(86) PCT No.: PCT/EP2020/051956
§ 371 (c)(1),
(2) Date: Jul. 28, 2021

(87) PCT Pub. No.: WO2020/157019
PCT Pub. Date: Aug. 6, 2020

(65) Prior Publication Data
US 2022/0099708 A1    Mar. 31, 2022

(30) Foreign Application Priority Data

Jan. 30, 2019   (EP) .................................... 19154562

(51) Int. Cl.
*G01R 15/20* (2006.01)
*G01R 19/00* (2006.01)
(Continued)

(52) U.S. Cl.
CPC ....... *G01R 15/202* (2013.01); *G01R 19/0092* (2013.01); *H01F 27/24* (2013.01);
(Continued)

(58) Field of Classification Search
CPC ...... G01R 1/04; G01R 15/183; G01R 15/202; G01R 15/207; G01R 19/0092;
(Continued)

(56) References Cited

U.S. PATENT DOCUMENTS 7,545,136 B2 * 6/2009 Racz .................... G01R 15/207
324/117 R
9,804,202 B2   10/2017 Labbe
(Continued)

FOREIGN PATENT DOCUMENTS

EP    2073025    6/2009
EP    2530475    12/2012
(Continued)

OTHER PUBLICATIONS

International Search Report and Written Opinion issued by the International Searching Authority, dated Apr. 7, 2020, for International Patent Application No. PCT/EP2020/051956; 14 pages.
(Continued)

*Primary Examiner* — Jay Patidar
(74) *Attorney, Agent, or Firm* — Faegre Drinker Biddle & Reath LLP

(57) ABSTRACT

An electrical current transducer including a magnetic core and a magnetic field detector module, the magnetic core and magnetic field detector module each forming a single unit separably mountable around a primary conductor and to a circuit board, the magnetic core having a general U shape including an end branch and lateral branches extending the end branch to respective free ends, the magnetic field detector module being positioned between the lateral branches and extending across a whole width of a gap formed between the lateral branches. The magnetic field detector module includes at least one magnetic field sensing cell, a pair of magnetic concentrators arranged in mirror
(Continued)

opposition forming a magnetic field gap therebetween in which the at least one sensing cell is positioned, and an insulating body supporting the magnetic concentrators and at least one sensing cell.

15 Claims, 3 Drawing Sheets

(51) Int. Cl.
      *H01F 27/24*       (2006.01)
      *H01F 27/28*       (2006.01)
      *H05K 1/18*       (2006.01)

(52) U.S. Cl.
      CPC ............. *H01F 27/28* (2013.01); *H05K 1/181* (2013.01); *H05K 2201/1003* (2013.01); *H05K 2201/10151* (2013.01)

(58) Field of Classification Search
      CPC ....... G01R 1/0416; H01F 27/24; H01F 27/28; H05K 1/181; H05K 2201/1003; H05K 2201/10151
      See application file for complete search history.

(56) References Cited

U.S. PATENT DOCUMENTS

| | | | |
|---|---|---|---|
| 11,313,881 B2 * | 4/2022 | Krummenacher | ..... G01R 1/203 |
| 2007/0279053 A1 | 12/2007 | Taylor | |
| 2012/0306486 A1 * | 12/2012 | Racz | ...................... G01R 15/20 |
| | | | 324/252 |
| 2013/0187633 A1 | 7/2013 | Yasui | |
| 2014/0009143 A1 | 1/2014 | Blagojevic | |
| 2014/0077797 A1 | 3/2014 | Nagao | |
| 2015/0309080 A1 * | 10/2015 | Chae | ................... G01R 15/202 |
| | | | 324/251 |
| 2016/0146858 A1 | 5/2016 | Miyakoshi | |
| 2020/0064380 A1 * | 2/2020 | Li | ........................ G01R 15/207 |

FOREIGN PATENT DOCUMENTS

| | | | | |
|---|---|---|---|---|
| EP | 2924451 | | 9/2015 | |
| EP | 3159705 | | 4/2017 | |
| EP | 3306325 B1 * | 7/2021 | ............. G01D 3/024 |
| JP | H09127159 | | 5/1997 | |
| JP | H11261131 | | 9/1999 | |

OTHER PUBLICATIONS

Vadula, et al. "Point Field Detection-based Current Sensing: Design and Implementation", 2018 IEEE Electronic Power Grid (EGRID), Nov. 12, 2018, pp. 1-6.

Lee Andrew, et al. "Design Issues for Magnetic Field-Based Current Sensing in Electric Machine Drive Applications", 2018 IEEE International Conference on Electro/Information Technology (EIT), May 3, 2018, pp. 610-614.

* cited by examiner

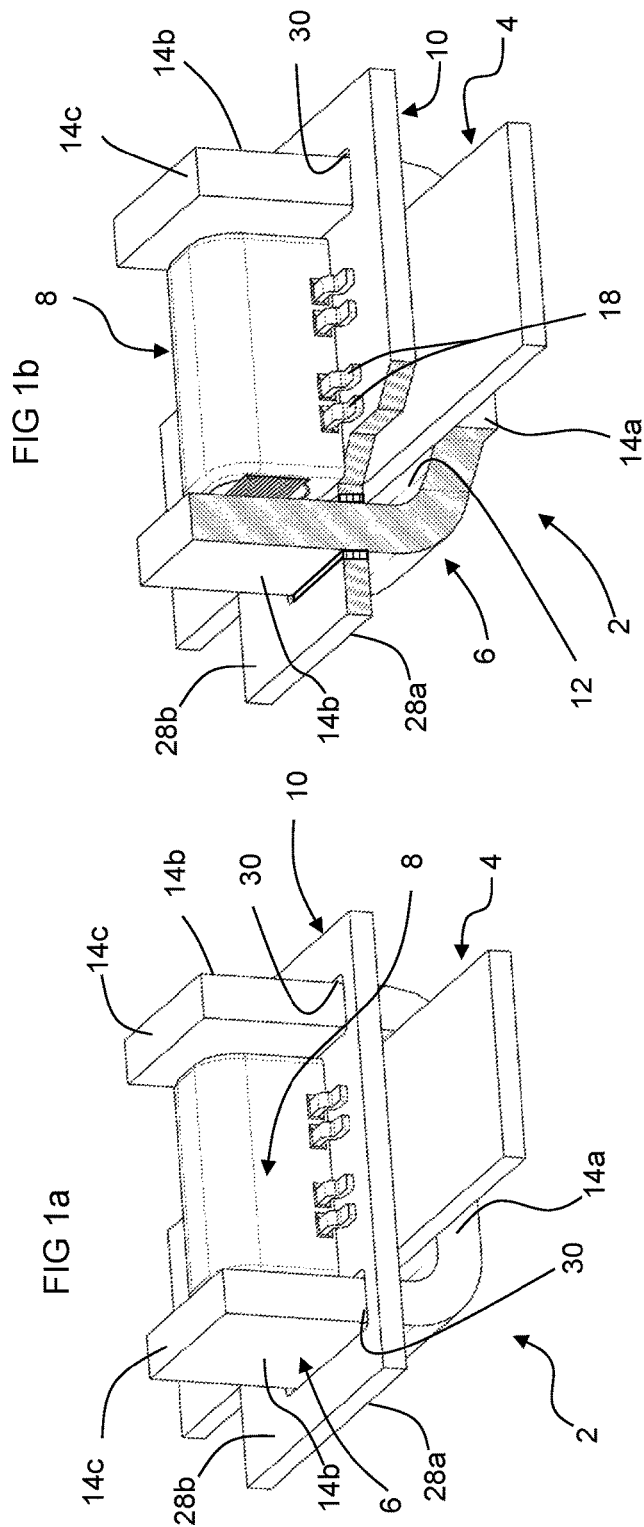
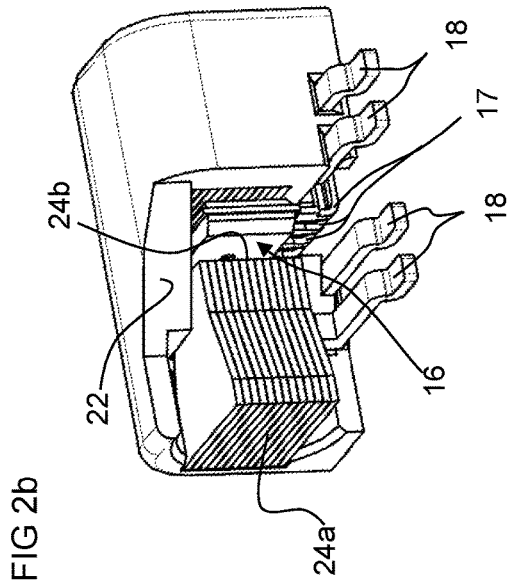
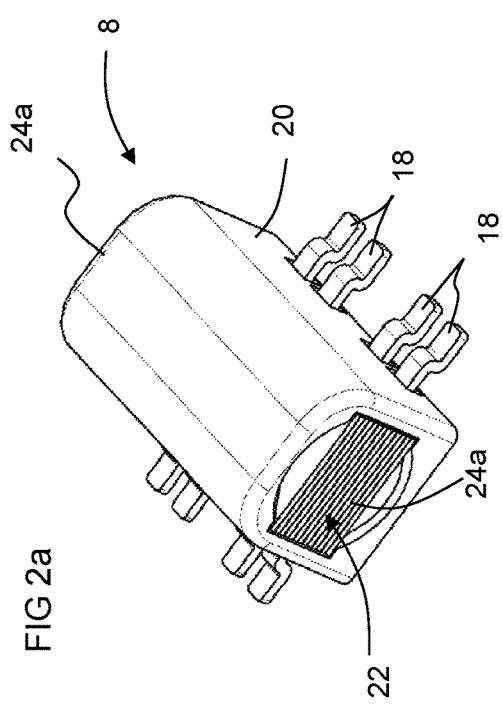

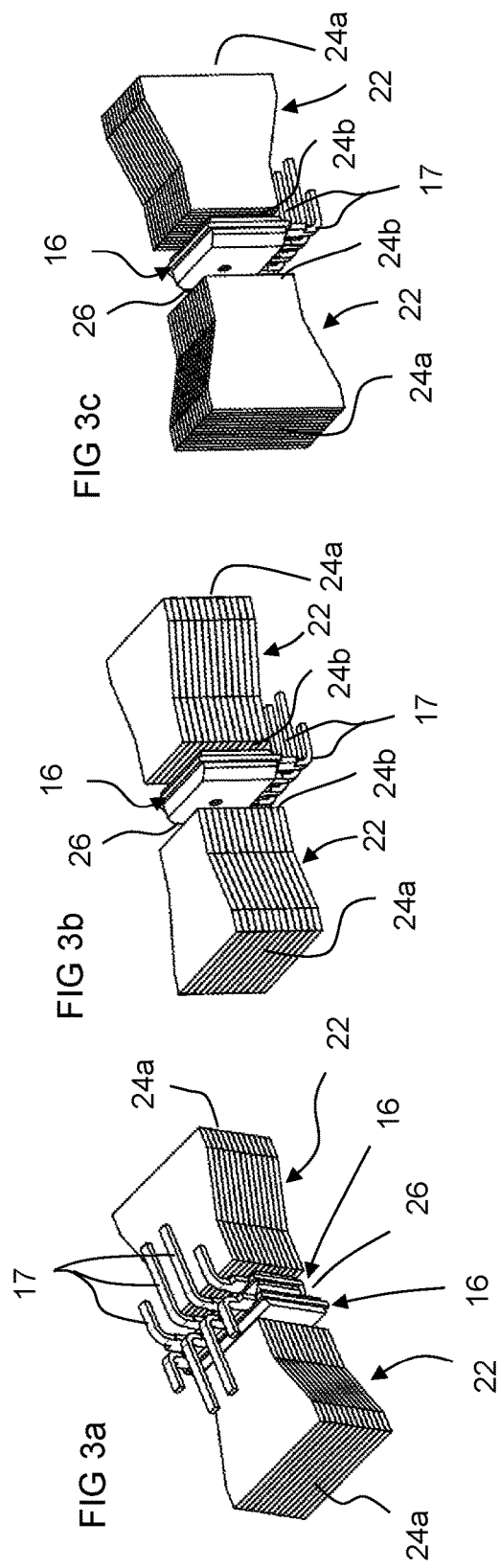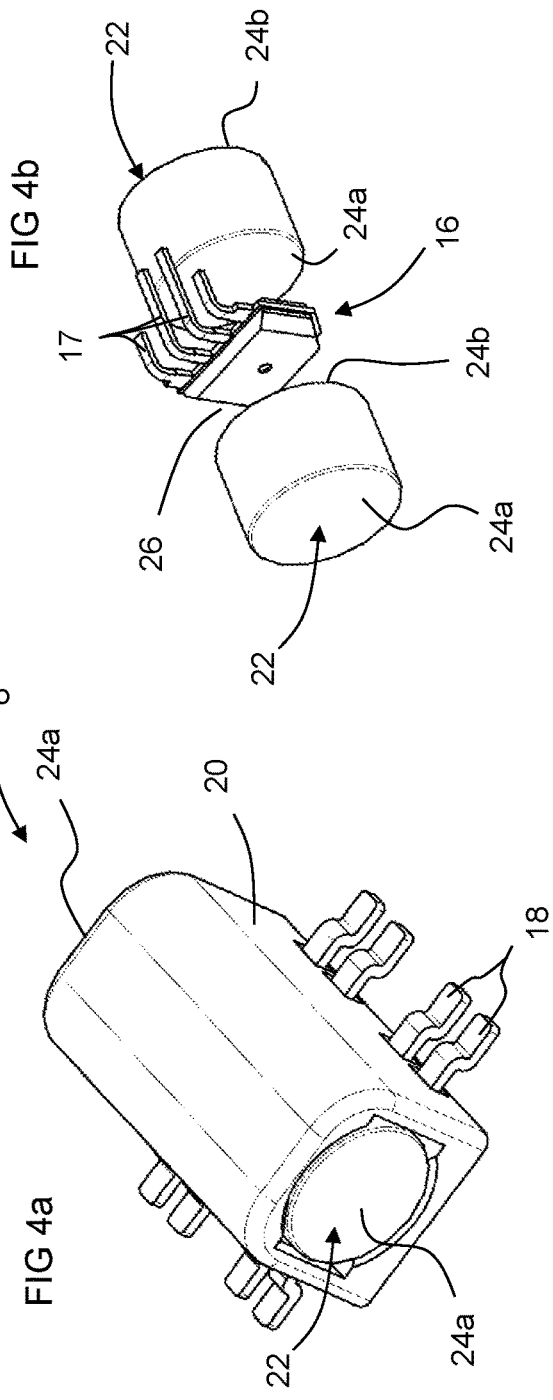

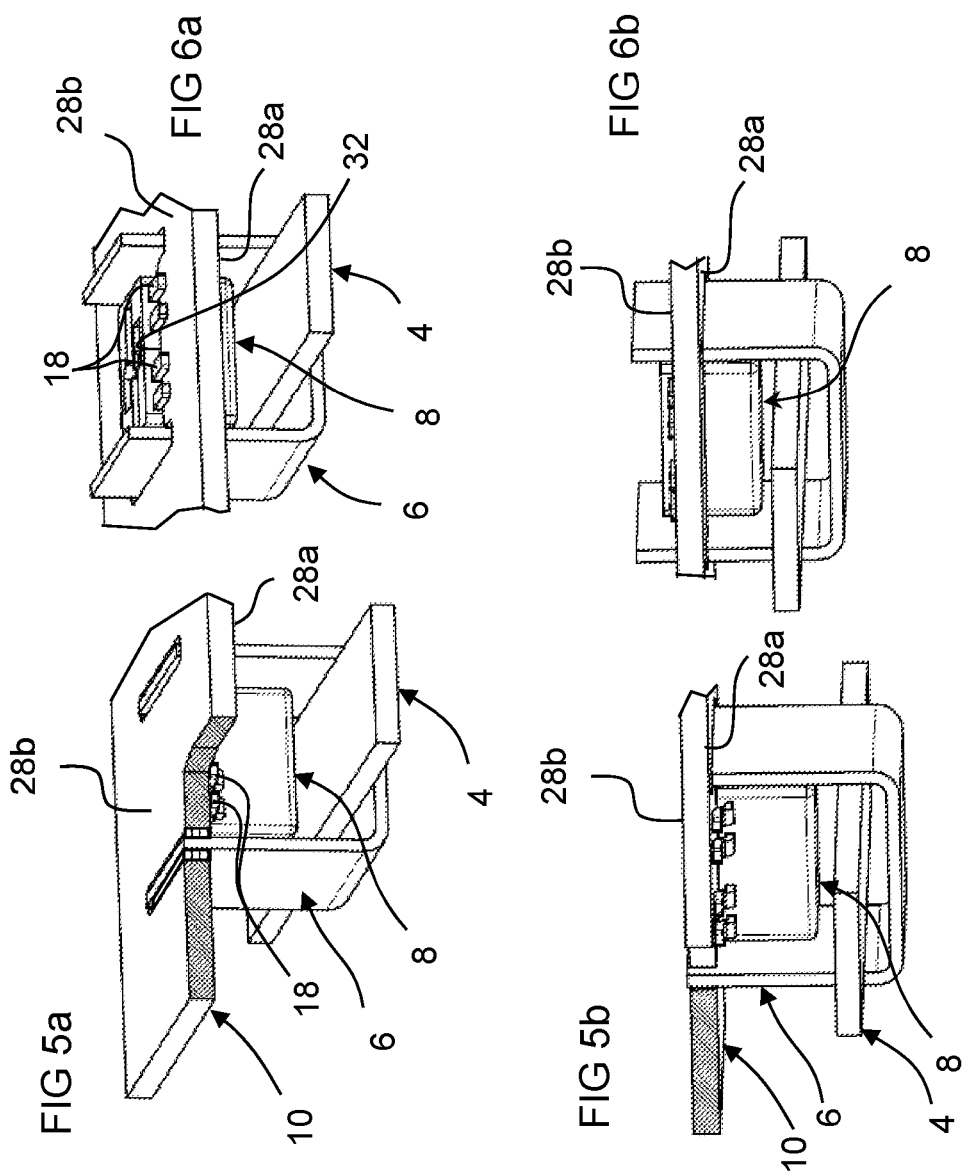

CURRENT TRANSDUCER WITH MAGNETIC FIELD DETECTOR MODULE

CROSS-REFERENCE TO RELATED APPLICATIONS

The present application is a national stage entry of International (PCT) Patent Application Number PCT/EP2020/051956, filed Jan. 27, 2020, which claims priority to European Patent Application No. 19154562.3, filed Jan. 30, 2019, the subject matter of each is expressly incorporated herein by reference.

The present invention relates to an electric current transducer comprising a magnetic core and a magnetic field detector in an air-gap of the magnetic core, for measuring an electrical current flowing in a primary conductor extending through a central passage of the magnetic core.

Electrical current sensors are used in a large variety of applications for monitoring or controlling electrical devices and system and in many applications there is an important advantage in reducing the manufacturing cost of such components and in particular the cost of assembling the components of the sensor.

Although certain current transducers are provided without a magnetic core for cost and/or size reasons, this generally reduces reliability and/or sensitivity and/or accuracy and/or operating range of the transducer compared to one provided with a magnetic core surrounding the primary conductor. Therefore, many electrical current transducers for current sensing applications comprise a magnetic core made of a high permeability magnetic material, surrounding a central aperture through which passes a primary conductor carrying the current to be measured. In many applications, the current transducer is mounted on a circuit board, for interconnecting the magnetic field detector signal and power supply contacts to control circuitry of an electrical device, for instance of an electrical motor. Often, especially for high power applications, the primary conductor comprises a rigid conductive bar that is integrated in the current transducer and presents connection ends for connection to a primary conductor connected to the electrical device. There may typically be a plurality of current transducers and associated primary conductor bars mounted on a circuit board, for instance for connection to a plurality of electrical phases of the electrical device.

The provision of a separately manufactured transducer as a single component for mounting on a circuit board however is often not optimal in terms of size and weight.

An object of the invention is to provide an electrical current transducer for mounting on a circuit board, with integrated magnetic field detector and magnetic core for mounting around a primary conductor, which is accurate, reliable and robust, yet compact and cost effective to manufacture, in particular that is easy and cost effective to assemble.

It is advantageous to provide an electrical current transducer that has a large operating range.

Objects of the invention have been achieved by providing a current transducer and a method of assembling a current transducer as described in embodiments below.

Disclosed herein is an electrical current transducer comprising a magnetic core and a magnetic field detector module, the magnetic core and magnetic field detector module each forming a single unit separably mountable around a primary conductor and to a circuit board, the magnetic core having a general U shape comprising an end branch and lateral branches extending the end branch to respective free ends, the magnetic field detector module being positioned between the lateral branches and extending across a whole width of a gap formed between the lateral branches such that the magnetic field detector module contacts opposed inner sides of said lateral branches, said inner sides arranged substantially orthogonally to the circuit board. The magnetic field detector module comprises at least one magnetic field sensing cell, a pair of magnetic concentrators arranged in mirror opposition forming a magnetic field gap therebetween, the at least one sensing cell being positioned inside the magnetic field gap, and an insulating body supporting the magnetic concentrators and at least one sensing cell.

Also disclosed herein is a method of assembling the electrical current transducer comprising: (a) mounting the magnetic field detector module on the circuit board; (b) mounting the magnetic core around the primary conductor and inserting the free ends of the magnetic core through the orifices (30) of the circuit board, whereby the magnetic field detector module is positioned between the lateral branches and extends across a whole width of a gap formed between the lateral branches such that the magnetic field detector module contacts opposed inner sides of said lateral branches, said inner sides arranged substantially orthogonally to the circuit board.

In an embodiment, the primary conductor is positioned adjacent a first magnetic side of the circuit board and the magnetic field detector module is mounted on a second side of the circuit board.

In an embodiment, the magnetic field detector module is mounted principally on a first side of the circuit board and the primary conductor is positioned adjacent the magnetic field detector module on said first side of the circuit board.

In an advantageous embodiment, the lateral branches of the magnetic core are substantially parallel to each other.

In an advantageous embodiment, the lateral branches are substantially orthogonal to the end branch of the magnetic core.

In an advantageous embodiment, each magnetic concentrator extends from a core branch end adjacent a respective lateral branch, to a detector end forming a face of the magnetic field gap, a ratio of a surface area Ab of the detector end divided by a surface area Aa of the core branch end being less than 80% (Ab/Aa<80%), preferably in a range of 50% to 80% (50%<Ab/Aa<80%).

In an advantageous embodiment, each magnetic concentrator extends from a core branch end adjacent a respective lateral branch, to a detector end forming a face of the magnetic field gap, the core branch end being in direct contact with a respective said lateral branch of the magnetic core.

The direct contact may also include a direct electrical contact, for instance for grounding of the magnetic core whereby the magnetic concentrators may be connected to a terminal for connection to ground.

In an embodiment, the lateral branches of the magnetic core are inserted through orifices in the circuit board.

In an embodiment, the lateral branches of the magnetic core may be coupled, for instance by soldering, to the circuit board provided with a metal layer on the edges of the orifices. The conductive interconnection may also serve as a ground connection in an embodiment.

In an advantageous embodiment, the at least one sensing cell is in a form of an application specific integrated circuit (ASIC) having terminals for power and signal transmission.

In an advantageous embodiment, the ASIC comprises a Hall Effect detector.

In embodiments, the terminals either form connection terminals for direct connection to the circuit board or are connected to terminals formed from a stamped lead frame and supported within the insulating body.

In an advantageous embodiment, the insulating body comprises a polymer material overmolded over the magnetic concentrators and the at least one sensing cell.

In an advantageous embodiment, the insulating body does not cover core branch ends of the pair of opposed magnetic concentrators such that the core branch ends may be in direct contact with inner sides of the lateral branches of the magnetic core.

In an embodiment, the transducer comprises two said sensing cells adjacently mounted in the magnetic field gap.

Further objects and advantageous features of the invention will be apparent from the claims, from the detailed description, and annexed drawings, in which:

FIG. 1a is a perspective view of an electrical current transducer according to an embodiment of the invention;

FIG. 1b is a perspective partial cross sectional view of the electrical current transducer of FIG. 1a;

FIG. 2a is a perspective view of a magnetic field detector module of an electrical current transducer according to an embodiment of the invention;

FIG. 2b is a perspective partial cross sectional view of the magnetic field detector module of FIG. 2a;

FIGS. 3a to 3c illustrate in perspective magnetic concentrators and sensing cells of current transducers according to embodiments of the invention;

FIG. 4a is a perspective view of a magnetic field detector module of an electrical current transducer according to another embodiment of the invention;

FIG. 4b is a perspective view of magnetic concentrators and sensing cell of the magnetic field detector module of FIG. 4a;

FIGS. 5a and 5b illustrate in perspective an electrical current transducer according to a second embodiment of the invention;

FIGS. 6a and 6b illustrate in perspective an electrical current transducer according to a third embodiment of the invention;

Referring to the figures, an electrical current transducer 2 according to embodiments of the invention comprises a magnetic core 6, a magnetic field detector module 8, a circuit board 10 and a primary conductor 4 for carrying a primary current to be measured by the electrical current transducer 2.

The magnetic core 6 has a general U shape comprising an end branch 14a and lateral branches 14b extending from ends of the end branch 14a to respective free ends 14c. In a preferred embodiment, the lateral branches 14b are substantially parallel to each other. In a preferred embodiment, the lateral branches are substantially orthogonal to the end branch 14a.

The magnetic field detector module 8 is positioned between the lateral branches 14b and extends across the whole width of a gap formed between the lateral branches 14b. The magnetic core 6 and magnetic field detector module 8 surround a passage 12 through which the primary conductor 4 extends.

The primary conductor 4 may be in the form of a rigid bar shaped conductor. In variants, the primary conductor 4 may comprise other configurations for instance in the form of a dielectric material supporting one or more conductors thereon, for instance in a form of a circuit board having a primary conductor printed or otherwise positioned thereon. While in the illustrated embodiment the primary conductor bar has a rectangular shape, other profiles such as square, polygonal, elliptical, circular and irregular bar shapes may be provided. The primary conductor bar 4 may have a substantially constant cross section over the length of the transducer or may have a non-constant cross section, for instance a smaller width along a section extending through the passage 12 formed by the magnetic core 6.

Ends of the conductor bus bar (not shown) may have various configurations for interconnection to a primary conductor supplying the current to be measured. The primary conductor bar may also be interconnected by soldering, welding, clamping or other means to conductive tracks formed on the circuit board 10 or to connection ends of a primary conductor.

The free ends 14c of the lateral branches 14b of the magnetic core 6 may be inserted through orifices 30 extending through the circuit board 10 between a first side 28a and a second side 28b of the circuit board.

In a first embodiment as illustrated in FIG. 1, the primary conductor 4 is positioned adjacent the first side of the circuit board 10, and the magnetic field detector module 8 is mounted on the second side 28b of the circuit board 10. The free ends 14c of the lateral branches 14b of the magnetic core 6 extend through the orifices 30 to a height H from the second side 28b, the height being sufficient for positioning the magnetic field detector module 8 between the lateral branches 14b. The magnetic field detector module comprises connection terminals 18 that interconnect to conductive circuit traces formed on the circuit board 10 the circuit traces are interconnected to control electronics of an electrical device connected to the primary conductor 4 in which the current to be measured flows.

In other embodiments illustrated in FIGS. 5a-5b, and 6a-6b, the primary conductor 4 is positioned facing the first side 28a of the circuit board 10, and the magnetic field detector module 8 is positioned principally on the first side 28a.

In a first variant illustrated in FIGS. 5a and 5b, the magnetic field detector module is mounted on the first side 28a, the magnetic core 6 being mounted over both the primary conductor 4 and the magnetic field detector module 6 on the first side 28a of the circuit board.

In a second variant as illustrated in FIGS. 6a and 6b, the circuit board 10 comprises an orifice 32 for the magnetic field detector module inserted through the circuit board from the second side 28b.

The magnetic core 6 is made of a soft magnetic material as per se well known in the field of magnetic cores for current transducers, and forms a path of low magnetic resistance to capture the magnetic flux generated by the primary current flowing in the primary conductor 4. The magnetic field detector module 8 is magnetically coupled to the lateral branches of the magnetic core.

The magnetic field detector module 8 comprises at least one magnetic field sensing cell 16, a pair of magnetic concentrators 22 arranged in mirror opposition forming a magnetic field gap 26 therebetween in which the one or more sensing cells 16 is/are positioned, and an insulating body 20 supporting the magnetic concentrators 22 and sensing cell(s) 16. Each magnetic concentrator extends from a core branch end 24a adjacent respective lateral branches 14b, either in direct contact with the lateral branches 14b or in close proximity thereto, to a detector end 24b forming a face of the magnetic field gap 26. Magnetic concentrators 22 thus concentrate the magnetic flux circulating in the U shaped magnetic core through the magnetic field gap 26.

In a first variant, for instance as illustrated in FIGS. 4a, 4b, the magnetic concentrators may be made of a ferrite material with a high magnetic permeability the geometry of the ferrite material being selected such that the flux density inside the ferrite is less than a half the saturation flux density of the material. This allows the ferrite properties to be preserved up to a temperature exceeding half of its Curie temperature. In an advantageous embodiment, the ferrite properties are preserved up to a temperature of at least 120 degrees centigrade preferably up to 125 degrees centigrade.

In other variants, as illustrated in FIG. 3a-3c, the magnetic concentrators 22 may be formed of an iron silicon material FeSi that may be formed of stamped metal sheets, a plurality being stacked to form a laminated structure. Laminated structures are per se well known in the art of magnetic armatures.

In advantageous embodiments, for instance as illustrated in FIGS. 3a-3c, the core branch end 24a has a surface area facing the lateral branch that is greater than a surface area of the detector end 24b facing the magnetic field gap. This allows the magnetic field detector module 8 to concentrate magnetic flux through the sensing cell(s) 16 positioned in the magnetic field gap 26 while at the same time reducing the risk of saturation in the magnetic core, and in particular at the interfaces between the magnetic core 6 and the magnetic concentrators 22.

In an advantageous embodiment, the ratio of the surface area $A_b$ of the detector end face 24b over the surface area $A_a$ of the core branch interface 24a is preferably less than 80% ($A_b/A_a<80\%$), preferably in a range of 50 to 80% ($50\%<A_b/A_a<80\%$).

The sensing cell 16 may advantageously be in a form of an application specific integrated circuit (ASIC) having terminals 17 for connection to conductive circuit traces on the circuit board 10 for power and signal transmission. The ASIC may comprise a Hall effect detector, however the sensing cell may comprise other per se well known magnetic field detectors. The terminals 17 either form connection terminals for direct connection to the circuit board 10 or may be connected to terminals 18 supported in an insulating body 20 of the magnetic field detector module 8. The terminals 18 may advantageously be formed from a stamped lead frame and supported within the insulating body 20.

In an advantageous embodiment, two sensing cells 16 may be adjacently mounted in the magnetic field gap. This allows to provide a redundant magnetic field detector for applications requiring increased safety or reliability. The sensing cells may advantageously be identical and mounted in mirror image symmetry. The two sensing cells may also be connected to control electronics in a manner to sum or to average the output signal of the sensing cells.

The insulating body may for instance comprise a polymer material overmolded over the magnetic concentrators 22 and the sensing cell 16. In a variant, the insulating body 20 may also be formed of one or more housing parts that are assembled and fixed around the magnetic concentrator and sensing cell(s).

In an advantageous embodiment, the insulating body 20 does not cover the core branch ends 24a of the pair of opposed magnetic concentrators 22 such that the core branch ends may be in direct contact with the inner sides of the lateral branches 14b of the magnetic core 6. The small magnetic field gap formed therebetween thus improves magnetic flux conduction between the magnetic core and the magnetic field concentrators. Moreover, this direct contact may also provide electrical interconnection between the magnetic core 6 and the magnetic concentrators 22 to provide a ground connection for the magnetic field concentrators 22 by interconnecting the magnetic core 6 to conductive circuit traces on the circuit board connected to electrical ground.

The lateral branches 14b may advantageously be inserted through the orifices 30 and soldered, welded, bonded by adhesive or fixed by mechanical means to the circuit board. In an embodiment, conductive pads or circuit traces lining the orifices 30 may be provided for mechanical and optionally electric coupling of the magnet core 6 to the circuit board 10. Instead of welding or soldering or brazing, other interconnection means would be possible within the scope of the invention, for instance by providing elastic contacts on the circuit board for clamping the lateral branches of the magnetic core or other mechanical fixing means such as with screws or rivets.

Advantageously, the magnetic field detector module comprising magnetic field concentrators and a magnetic sensing cell held in an insulating body as a separate and single unit mountable between lateral branches of a simple U shaped magnetic core, allows easy assembly and direct integration of the current transducer on a circuit board and around a primary conductor bar, as well as a compact configuration. Moreover, the separately formed magnetic field detector module 8 increases flexibility of the configuration, in particular for placing the primary conductor bar on a same side of the circuit board or on an opposite side of the circuit board with respect to the magnetic field detector module.

The formation of the magnetic field gap between magnetic field concentrators within which the sensing cell 16 is positioned, held in an insulating body, in particular an insulating body 20 that may be overmolded over the aforesaid components, ensures an accurate and stable magnetic field gap while allowing great flexibility in assembly around a primary conductor bar in a cost effective manner.

The invention thus facilitates assembly and increases mounting possibilities while ensuring accurate and stable measurement in a robust configuration.

LIST OF REFERENCES USED electric current transducer 2
  primary conductor 4
  magnetic core 6
    central passage 12
    end branch 14a
    lateral branches 14b
      free end 14c
  magnetic field detector module 8
    sensing cell(s) 16
      ASIC (e.g. Hall effect)
      Terminals 17
    Terminals 18
    insulating body 20
      overmold
    magnetic concentrators 22
      core branch end 24a
      detector end 24b
      magnetic field gap 26
  circuit board 10
    first side 28a
    second side 28b
    contact pads
    orifices for magnetic core 30
    orifice for magnetic field detector module 32

The invention claimed is:

1. An electrical current transducer comprising
a magnetic core; and
a magnetic field detector module, the magnetic core and magnetic field detector module each forming a single unit separably mountable around a primary conductor and to a circuit board, the magnetic core having a general U shape comprising an end branch and lateral branches extending from the end branch to respective free ends, the magnetic field detector module being positioned between the lateral branches and extending across a whole width of a gap formed between the lateral branches such that the magnetic field detector module contacts opposed inner sides of said lateral branches, said inner sides arranged substantially orthogonally to the circuit board, the magnetic field detector module comprising
at least one magnetic field sensing cell,
a pair of magnetic concentrators arranged in mirror opposition forming a magnetic field gap therebetween, the at least one sensing cell being positioned inside the magnetic field gap, and
an insulating body supporting the magnetic concentrators and at least one sensing cell.

2. The current transducer according to claim 1, wherein the lateral branches of the magnetic core are substantially parallel to each other.

3. The current transducer according to claim 1, wherein the lateral branches are substantially orthogonal to the end branch of the magnetic core.

4. The current transducer according to claim 1, wherein each magnetic concentrator extends from a core branch end adjacent a respective lateral branch, to a detector end forming a face of the magnetic field gap, a ratio of a surface area $A_b$ of the detector end divided by a surface area $A_a$ of the core branch end being less than 80% ($A_b/A_a < 80\%$).

5. The current transducer according to claim 1, wherein each magnetic concentrator extends from a core branch end adjacent a respective lateral branch, to a detector end forming a face of the magnetic field gap, the core branch end being in direct contact with a respective said lateral branch of the magnetic core.

6. The current transducer according to claim 5, wherein said direct contact provides an electrical interconnection between the magnetic field concentrators and magnetic core.

7. The current transducer according to claim 1, wherein the lateral branches of the magnetic core are inserted through orifices in the circuit board.

8. The current transducer according to claim 7, wherein the lateral branches of the magnetic core are coupled by soldering to a metal layer on edges of the orifices of the circuit board.

9. The current transducer according to claim 1, wherein the at least one sensing cell is in a form of an application specific integrated circuit (ASIC) having terminals for power and signal transmission, wherein the terminals either form connection terminals for direct connection to the circuit board or are connected to terminals formed from a stamped lead frame and supported within the insulating body.

10. The current transducer according to claim 1, wherein the insulating body comprises a polymer material overmolded over the magnetic concentrators and the at least one sensing cell.

11. The current transducer according to claim 1, wherein the insulating body does not cover core branch ends of the pair of opposed magnetic concentrators such that the core branch ends are may be in direct contact with inner sides of the lateral branches of the magnetic core.

12. The current transducer according to claim 1, wherein the at least one sensing cell comprises two sensing cells adjacently mounted in the magnetic field gap.

13. A method of assembling an electrical current transducer including a magnetic core having a general U shape comprising an end branch and lateral branches extending the end branch to respective free ends, a primary conductor bar, a circuit board comprising orifices for receiving said lateral branches, and a magnetic field detector module comprising at least one magnetic field sensing cell, a pair of magnetic concentrators arranged in mirror opposition forming a magnetic field gap therebetween in which the at least one sensing cell is positioned, an insulating body supporting the magnetic concentrators and sensing cell(s), and terminals for connection to the circuit board, the method comprising: (a) mounting the magnetic field detector module on the circuit board, (b) mounting the magnetic core around the primary conductor and inserting the free ends of the magnetic core through the orifices of the circuit board, whereby the magnetic field detector module is positioned between the lateral branches and extends across a whole width of a gap formed between the lateral branches such that the magnetic field detector module contacts opposed inner sides of said lateral branches, said inner sides arranged substantially orthogonally to the circuit board.

14. The method according to claim 13, wherein the primary conductor is positioned adjacent a first magnetic side of the circuit board and the magnetic field detector module is mounted on a second side of the circuit board.

15. The method according to claim 13, wherein the magnetic field detector module is mounted principally on a first side of the circuit board and the primary conductor is positioned adjacent the magnetic field detector module on said first side of the circuit board.

* * * * *